United States Patent
Vo et al.

(10) Patent No.: US 6,421,282 B1
(45) Date of Patent: Jul. 16, 2002

(54) CASCADE-BOOTED PROGRAMMING VOLTAGE CIRCUIT

(75) Inventors: Huy Thanh Vo; Raymond A. Turi, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/808,249

(22) Filed: Mar. 14, 2001

(51) Int. Cl.⁷ .................................................. G11C 7/00

(52) U.S. Cl. .............................. 365/189.11; 365/189.09

(58) Field of Search ....................... 365/189.09, 189.11, 365/225.7, 203

(56) References Cited

U.S. PATENT DOCUMENTS 6,058,050 A * 5/2000 Wu et al. ............... 365/189.09
6,108,246 A * 8/2000 Umezawa et al. ...... 365/189.09

* cited by examiner

Primary Examiner—Son Mai
(74) Attorney, Agent, or Firm—Schwegman, Lundberg, Woessner & Kluth, P.A.

(57) ABSTRACT

A memory device having a plurality of programming circuits. The programming circuits connect to an input pad to receive a programming voltage. When one of the programming circuits is activated during a programming operation, the activated programming circuit passes the programming voltage to a programming node connected to it. Non-activated programming circuits only pass a portion of the programming voltage to other programming nodes connected to them.

33 Claims, 6 Drawing Sheets

US 6,421,282 B1

CASCADE-BOOTED PROGRAMMING VOLTAGE CIRCUIT

TECHNICAL FIELD OF THE INVENTION

The present invention relates generally to integrated circuits, and in particular to programming circuits in a memory device.

BACKGROUND OF THE INVENTION

Semiconductor memory devices such as dynamic random access memory (DRAM) devices are widely used to store data in computers and electronic products. A memory device typically has a number of memory banks. Each of the memory banks has a large number of memory cells to store the data. The memory cells are typically arranged in rows and columns.

A typical memory device also has a number of spare memory cells, which are used to replace defective memory cells. When a row or column of the memory cells is defective, the address of the defective row or column is programmed. During a memory operation, a controller of the memory device compares an input address of a row or column with the programmed address. A match between the input address and the programmed address means that the input address is the address of a defective row or column. In this case, the row or column of the spare memory cells are accessed instead of the defective row or column.

The address of the defective row or column is programmed in a number of programmable elements of the memory device. The memory device has a programming circuit connected to a programming input pad of the memory device. During a programming operation, a programming voltage is applied at the programming input pad. The programming circuit receives the programming voltage, which is used to program the programmable elements. The programming voltage causes the programmable elements to form a pattern representing an address of a defective row. In this type of memory device, the memory banks are usually located in the same general location and only one programming circuit is used for all the memory banks.

As design of memory devices advances, some memory devices are designed with a modular design approach. In this approach, a memory device has a number of memory banks or memory macros scattered in different locations; and each of the memory macros has its own programming circuit. Thus, in a modular design, the memory has multiple programming circuits. However, all of the multiple programming circuits still connect to the same programming input pad. Thus, during a programming operation, when one programming circuit receives the programming voltage applied at the programming input pad to program programmable elements of one corresponding memory macro, other programming circuits also receive the programming voltage even though they are not used or activated.

When a programming circuit is not used or activated but receives a programming voltage, the programming voltage can cause damage to internal components of the programming circuit. This can lead to damage or failure of the programming circuit.

There is a need for a method to protect the programming circuits from damage in a memory device having multiple programming circuits.

SUMMARY OF THE INVENTION

The present invention is a memory device having multiple programming circuits. The programming circuits are protected from damage during a programming operation.

In one aspect, the memory device includes an input pad to receive a programming voltage, and a plurality of memory macros. Each of the memory macros has memory cells and programmable elements. The memory device also includes a plurality of programming circuits connected between the input pad and the memory macros. Each of the programming circuits has a precharge circuit connected between the input pad and a programming node. Each of the programming circuits also has an enable circuit connected to the precharge circuit. The enable circuit includes an enable input to receive an enable signal. When the program enable signal is activated, the bootstrap-regulator circuit passes the programming voltage to the programming node to program the programmable elements. When the program enable signal is not activated, the bootstrap-regulator circuit passes only a part of the programming voltage to the programming node and the programmable elements are not programmed.

In another aspect, a method of programming a memory device includes activating one programming circuit among: a plurality of programming circuits. A programming voltage is applied to an input pad connected to all programming circuits. The activated programming circuit passes the programming voltage to a programming node connected to it. Other non-activated programming circuits pass only a portion of the programming voltage to programming nodes connected to them.

DETAILED DESCRIPTION OF THE INVENTION

The following detailed description of the embodiments of the invention refers to the accompanying drawings which form a part hereof, and shows by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
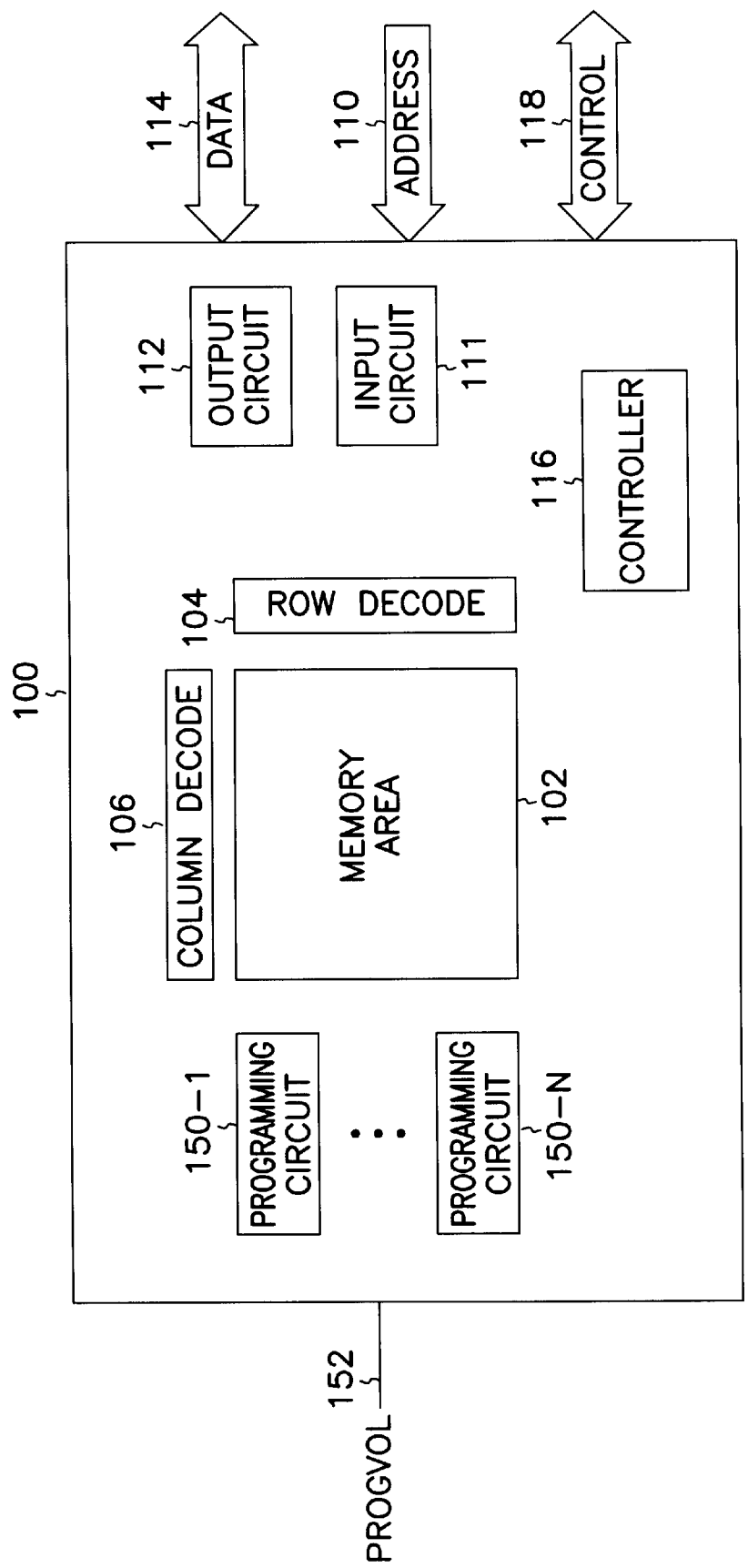
FIG. 1 illustrates a simplified block diagram of a memory device according to one embodiment of the invention.

FIG. 1 is a simplified block diagram of a memory device 100 according to one embodiment of the invention. In one embodiment, memory device 100 includes a memory area 102. Memory area 102 typically includes dynamic random access memory (DRAM) devices which include a plurality of memory cells arranged in rows and columns. Row decode 104 and column decode 106 access individual memory cells in the rows and columns in response to an address, provided on address bus or address lines 110 (ADDRESS). An input circuit 111 and an output circuit 112 connect to a data bus 114 (DATA) for bi-directional data communication with memory area 102. A memory controller 116 controls memory 100 responding to control signals provided on control lines 118. The control signals include, but are not limited to, an input clock signal (XCLK), clock enable (CKE), Chip Select (CS*), Row Access Strobe (RAS*), Column Access Strobe (CAS*), Write Enable (WE*). In addition, memory 100 also includes a programming input pad 152 to receive a programming voltage PROGVOL during a programming operation.

It will be appreciated by those skilled in the art that the memory device 100 of FIG. 1 can include additional circuitry and control signals, and that memory device 100 of FIG. 1 has been simplified to help focus on the invention. According to the invention, memory device 100 also includes a plurality of programming circuits 150 1–N. Programming circuits 150 1–N receive the programming voltage PROGVOL from input pad 152 during the programming operation.

It will be understood that the above description of a DRAM (Dynamic Random Access Memory) is intended to provide a general understanding of the memory and is not a complete description of all the elements and features of a DRAM. Furthermore, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

Figure 2:
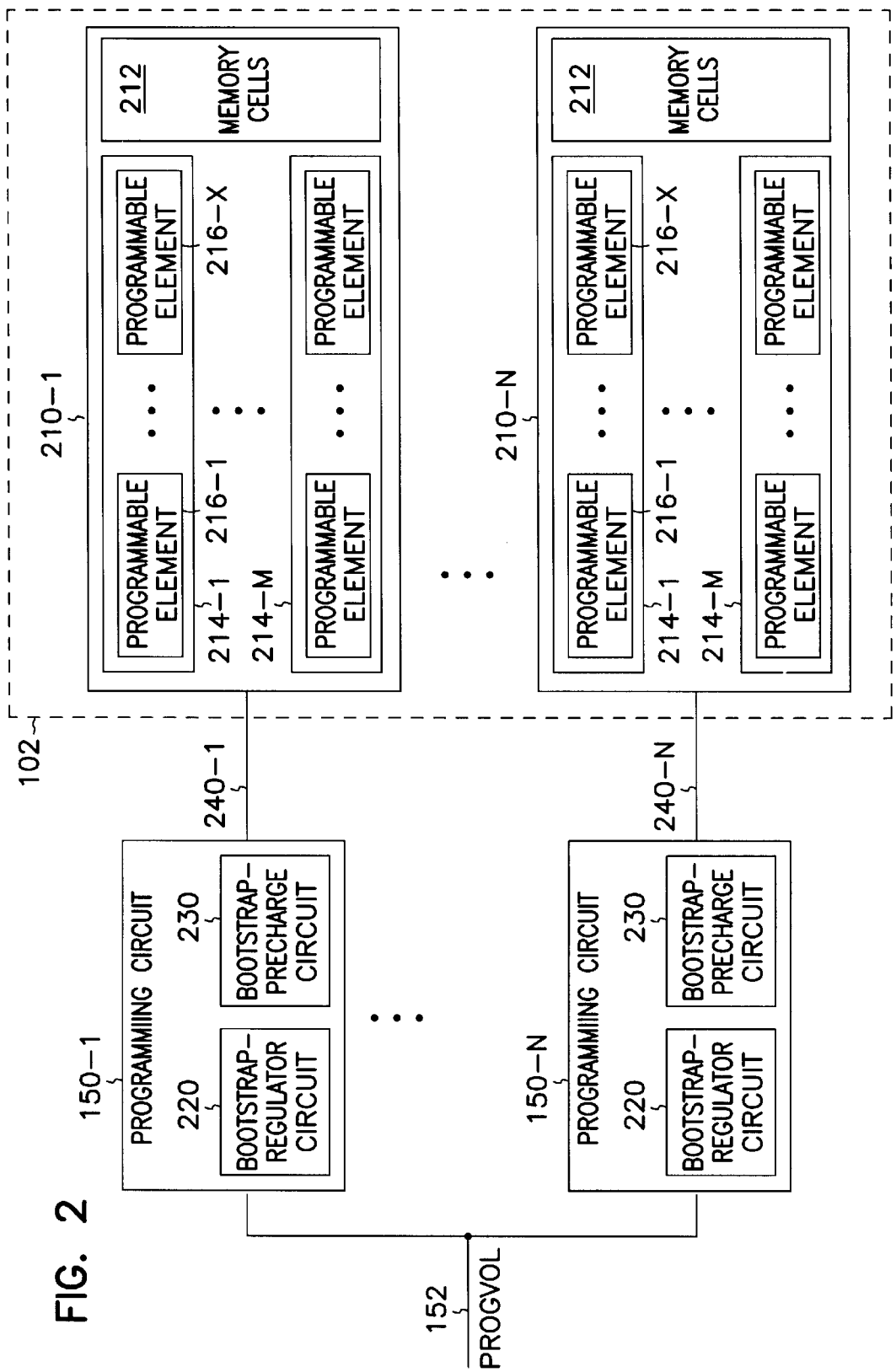
FIG. 2 shows in more detail programming circuits and memory area of the memory device of FIG. 1.

FIG. 2 shows in more detail programming circuits 150 1–N and memory area 102 of memory device 100 of FIG. 1. Memory area 102 has a plurality of memory macros 210 1–N. For simplicity, all of memory macros 210 1–N are group into one memory area 102. However, memory macros 210 1–N can be located anywhere within memory device 100. Each of the memory macros 210 1–N includes an array of memory cells 212 and a plurality of fuse banks 214 1–M. Each of the fuse banks includes a plurality of programmable elements 216 1–X. Programmable elements 216 1–X can be programed to store certain information of memory device 100. Programmable elements 216 1–X are anti-fuses. The anti-fuses can be programmed to form a pattern representing an address of a defective row or column of memory cells 212.

Each of the programming circuits 150 1–N connected to one of the memory macros 210 1–N through one of programming lines 240 1–N. For example, programming circuit 150-1 connects to memory macro 210-1 through line 240-1, and programming circuit 150-N connects to memory macro 210-N through line 240-N. All programming circuits 150 1–N connect to input pad 152. Each of the programming circuits 150 1–N includes a bootstrap-regulator circuit 220 and a bootstrap-precharge circuit 230. Throughout the description of the invention, terms such as line and node are used interchangeably. They refer to the same subject. For example, programming lines 240 1–N are also referred to as programming nodes 240 1–N, and programming line 240-1 is also referred to as programming node 240-1.

Programming circuits 150 1–N are used to transfer the programming voltage PROGVOL received at input pad 152 during programming operation to memory macros 210 1–N through nodes 240 1–N. The programming voltage is subsequently used to program programmable elements 216 1–X. As shown in FIG. 2, since one programming circuit connects to one corresponding memory macro, only one programming circuit is activated to program one corresponding memory macro. For example, to program programmable elements 216 1–X of memory macros 210-1, programming circuit 150-1 is used or activated, other programming circuits are not used.

Memory macros 210 1–N can be programed by two methods. In one method, one memory macro is programmed at a time by using one programming circuit. In another method, two or more macros are programmed at the same time by using two or more programming circuits. In either method, the programming voltage PROGVOL is applied at input pad 152.

Figure 3:
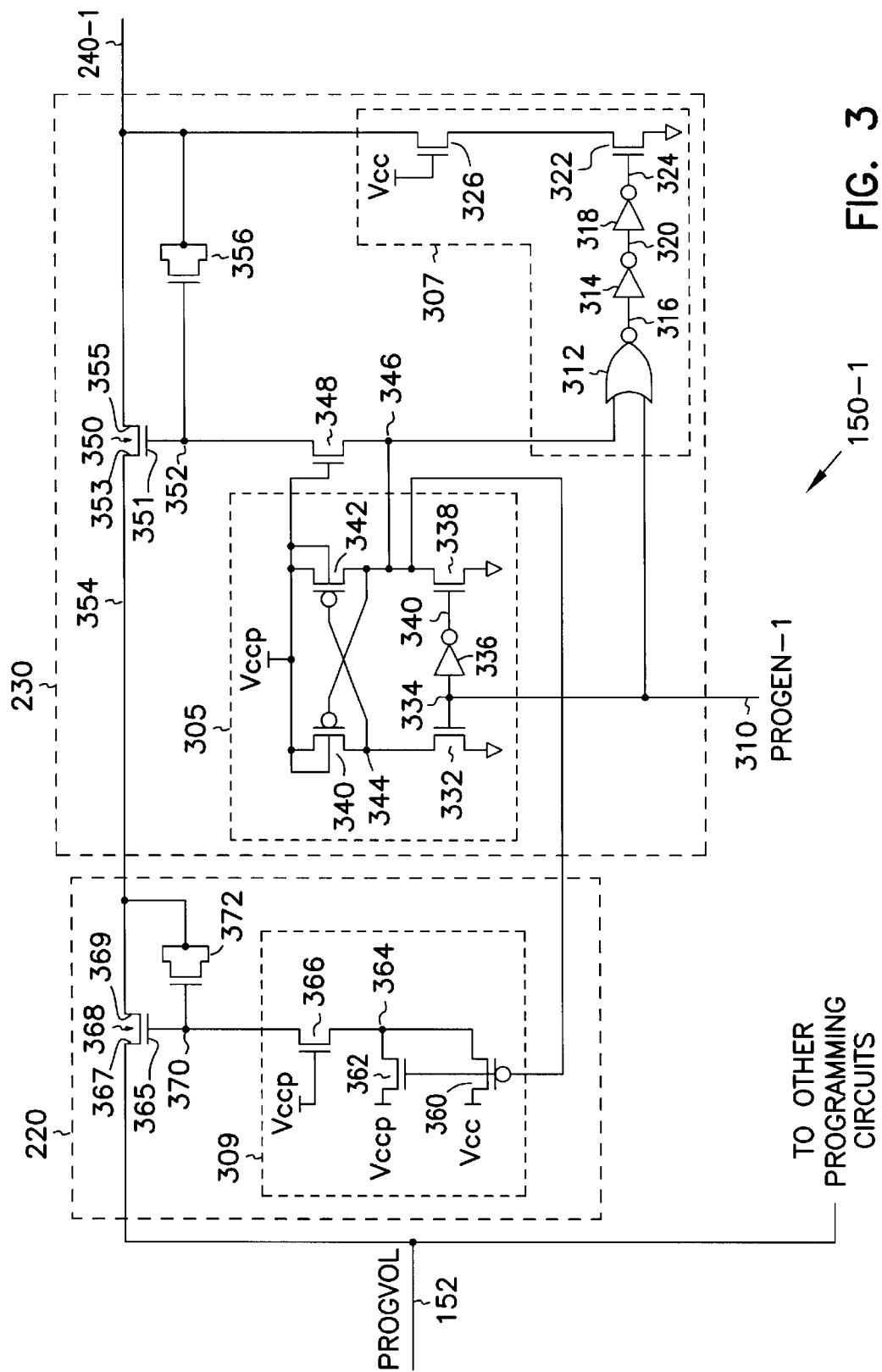
FIG. 3 is a schematic diagram of a programming circuit of FIG. 2.

FIG. 3 is a schematic diagram of a programming circuit of FIG. 2. In FIG. 3, a schematic of programming circuits 150-1 including circuit 220 and circuit 230 is shown. The constructions of circuit 220 and circuit 230 of other programming circuits are the same as the construction of circuit 220 and circuit 230 of programming circuit 150-1.

Circuit 230 includes an input at node 310 to receive a programming enable signal PROGEN-1. Enable input 310 connects to a pulldown circuit 307. Pulldown circuit 307 has a NOR gate 312, which has one of its input connected to enable input 310. NOR gate 312 connects to an input of an inverter 314 at node 316. An output of inverter 314 connects to an input of another inverter 318 at node 320. An output of inverter 318 connects to a gate of an n-channel transistor 322 at node 324. Transistor 322 has a source connected to ground and drain connected to a source of an n-channel transistor 326. Transistor 326 also has a gate connected to a high voltage potential at node 328, such as Vcc, and a drain connects to node 240-1.

An enable circuit 305 connects to enable input 310 at node 334. Enable circuit 305 includes an n-channel transistor 332, which has a gate connected to 334. An inverter 336 has an input connected to node 334, and an output connected to a gate of an n-channel transistor 338. Transistors 332 and 338 have their sources connected to ground. Cross-coupled p-channel transistors 340 and 342 have their sources connected to Vccp, and their drains connected to nodes 344 and 346 at the drains of transistors 322 and 338, respectively. Node 346 connects to another input of NOR gate 312 and a source of an n-channel transistor 348, which has a gate connected to Vccp and its drain connected to node 352. A pass transistor 350 connects to enable circuit 305 at node 352. Pass transistor 350 has a gate 351 and drain 353 and a source 355. Gate 351 connects to node 352, drain 353 connects to node 354 and source 355 connects to node 240-1. A bootstrap capacitor 356 connects between node 352 and node 240-1.

Circuit 220 includes a voltage regulator 309. Voltage regulator 309 connects to enable circuit 305 at node 346. Voltage regulator 305 has a p-channel transistor 360 and an n-channel transistor 362. Transistor 360 has its source connected to Vcc. Transistor 362 has its drain connected to Vccp. The gates of both transistors 360 and 362 connect to node 346. The drain and source of both transistors 360 and 362 connect to node 364. Node 364 connects to the source of an n-channel transistor 366. Transistor 366 has a gate connected to Vccp, and a drain connected to node 370. Transistor 368 connects to voltage regulator 309 at node 370. Transistor 368 has a gate 365, a drain 367 and a source 369. Gate 365 connects to node 370, drain 367 connects to input pad 152, and source 369 connects to node 354. A capacitor 372 connects between node 370 and node 354. Input pad 152, as shown previously in FIG. 2, also connects to other programming circuits.

Throughout the description, terms such as source and drain are used interchangeably. They refers to two termninals of a transistor besides the gate termninal. When the source is referred to one terminal, the other terminal is referred to as the drain, and vice versa. Furthermore, FIG. 3 only shows one programming signal PROGEN-1, however, each of the other programming circuits also has a node, like node 310, to receive a programming signal. For example, programming circuit 150-N also has a node like node 310 to receive a programming enable signal PROGEN-N. In addition, Vcc refers to the voltage supply and Vccp refers to a higher voltage than the voltage supply. In one embodiment, the voltage supply is about 2.5 volts and Vccp is about 4 volts. In general, Vccp is about Vcc+2Vt, where Vt is the threshold voltage of a transistor. The threshold voltage is about 0.6 to 0.7 volt, and the programming voltage PROGVOL is approximately 9 volts.

To better illustrate how circuit 220 and circuit 230 function as a whole, it is better to understand the operation of circuit 230 first. Therefore, it is assumed that circuit 220 is taken out of FIG. 3 in the following description of the operation of circuit 230. After the description of the operation of circuit 230, circuit 220 is inserted back in FIG. 3; that way, it is easier to understand the operation and purpose of circuit 220.

Figure 4:
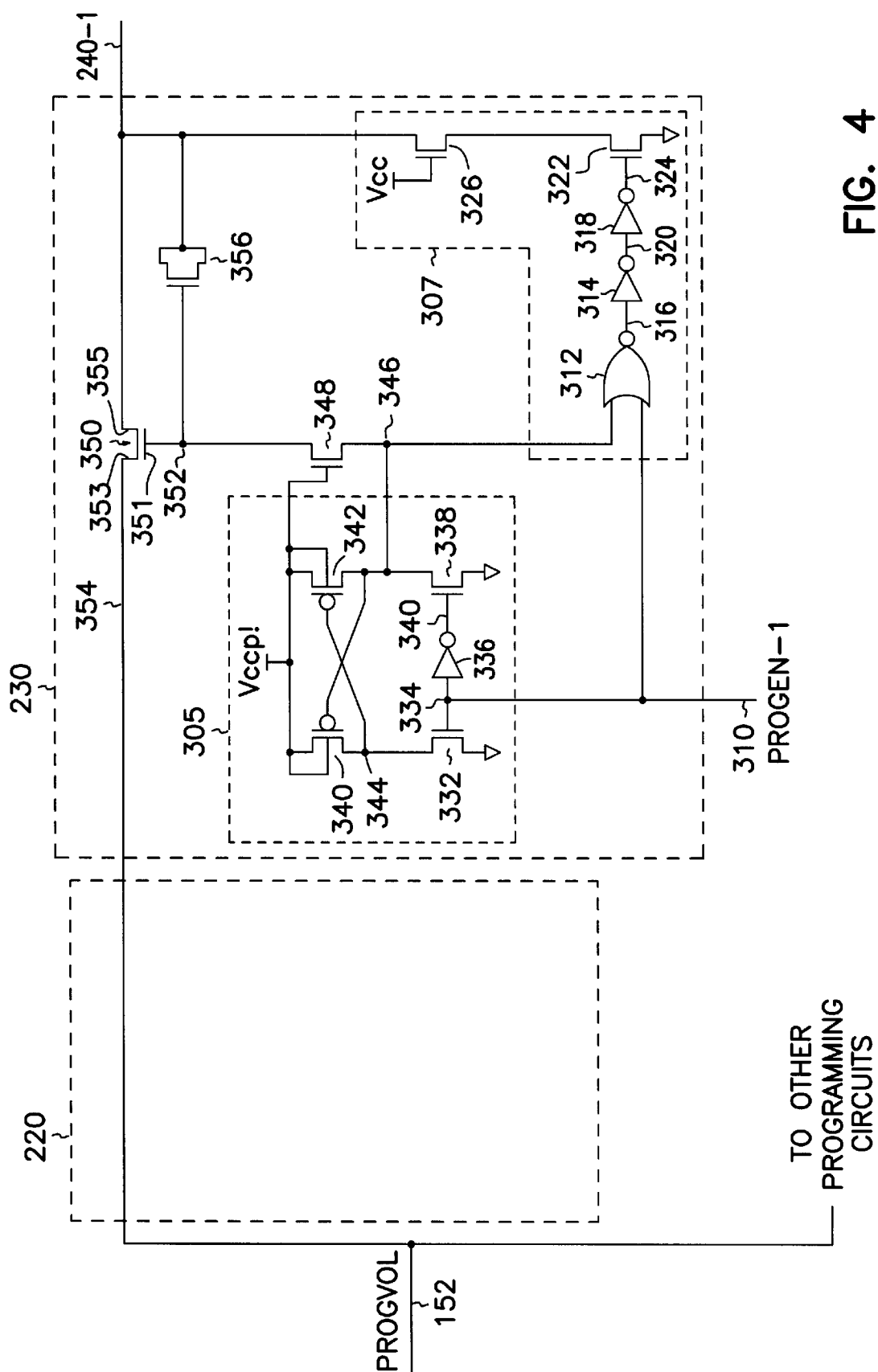
FIG. 4 is a schematic diagram of the programming circuit of FIG. 2 without a bootstrap-regulator circuit.

FIG. 4 is a schematic diagram of programming circuit 150-1 of FIG. 3 without circuit 220. In FIG. 4, without circuit 220, node 354 connects directly to input pad 152. Thus, input pad 152 and transfer node 354 in FIG. 4 are the same node. The operation of circuit 230 is now described. Before a programming operation, program enable signal PROGEN-1 is not activated, node 310 is at a low signal level (LOW). A LOW on node 310 forces a high signal level (HIGH) to the output of NOR gate 312 on node 316. A HIGH on node 316 causes a LOW on node 320 and a HIGH on node 324, which turns on transistor 322. At this time, transistor 326 is also on because its gate connects to a high voltage potential. When both transistors 322 and 326 are on, node 240-1 is pulldown to ground or zero.

In the mean time, a LOW on node 310 causes a HIGH on node 340, which turns on transistor 338. When transistor 338 is on, it pulls the potential of node 346 to ground. Since transistor 348 is on at this time because its gate connects to a high voltage potential, node 352 is also pulled to ground or has zero volts. In summary, when PROGEN-1 is LOW, programming circuit 150-1 is not activated. Node 240-1 has zero volt and no programming is: performed to memory macro 210-1.

At the beginning of a programming operation, the program enable signal PROGEN-1 at node 310 is activated or makes a transition from LOW to HIGH. A HIGH on node 310 turns on transistor 332 pulling node 344 to ground or LOW. A LOW on node 344 turns on transistor 342, which pulls node 346 to Vccp. At this time, transistor 348 is on because its gate connects to a high potential (Vccp). When transistor 348 is on, the potential at node 352 is gradually charged up close to the potential of node 346 (Vccp). When node 352 is at Vccp-Vt (Vt is the threshold voltage of transistor 348), transistor 348 is off, which keeps node 352 float or disconnected from node 346. When node 352 is at Vccp-Vt, it turns on pass transistor 350 in preparation to pass a voltage potential from input pad 152 to node 240-1.

After transistor 350 is on, the programming voltage PROGVOL is applied to input pad 152. For the purpose of describing this invention, the programming voltage PROGVOL is assumed to be about 9 volts. However, the programming voltage PROGVOL can be any voltage, which is appropriate to program programmable elements 216 1–X. Since node 240-1 connects to node 352 by bootstrap capacitor 356, an increase in voltage level of node 240-1 causes an increase in the voltage level of node 352 by a fraction amount or by the same proportion.

Before the programming voltage PROGVOL is applied to input pad 152, voltage levels at input pad 152 and node 240-1 are zero, and voltage level at node 352 is Vccp-Vt. When the programming voltage PROGVOL is applied to input pad 152, transistor 350 passes it to node 240-1. At node 240-1, the voltage level increases from zero to the level of the programming voltage PROGVOL. At node 352, the voltage level also increases by the same proportion. Thus when the voltage level of node 240-1 increases from zero to 9 volts (increased by 9 volts), the voltage level of node 352 increases from Vccp-Vt to Vccp-Vt plus a fraction of 9 volts. In this case, Vccp-Vt is about 3 volts, thus, node 352 increases from 3 to roughly 10 to 11 volts (increased by a fraction of 9 volts). Therefore, the voltage level of node 352 is always higher than the voltage level of node 240-1. This allows transistor 350 to fully pass the programming voltage PROGVOL from input pad 152 to node 240-1.

In summnary, when there is no programming operation, the programming voltage PROGVOL is not applied at input pad 152, and the voltage level of node 354 is zero. The voltage level of node 352 is also zero when the PROGEN-1 is not activated. Therefore, a voltage difference between node 354 and node 352 in this case is zero. When there is a programming operation, the programming voltage PROGVOL, about 9 volts, is applied at input pad 152, thus the voltage at node 354 is the about 9 volts. If programming circuit 150-1 is used during the programming operation, the PROGEN-1 signal is activated causing the voltage at node 352 to be charged up to about 10 to 11 volts. The voltage difference between node 354 and node 352 in this case is about 1 to 2 volts (10 or 11 volts–9 volts).

Since drain 351 and gate 353 of pass transistor 350 connects to nodes 354 and 352, respectively, the voltage difference between nodes 352 and nodes 353 is also the voltage difference between nodes 354 and 352, the voltage difference of zero volts and 2 volts as described above does not exceed an operating voltage limit or a safe value between a junction of drain 353 and gate 351 of pass transistor 350. However, since all programming circuits 150 1–N connect to the same input pad 152, the voltage difference between drain 351 and 353 can exceed 2 volts. For example, when enable signal PROGEN-l is not activated because programming circuit 150-1 is not being used, but one of the other programming circuits is used, the programming voltage PROGVOL is applied to input pad 152. Thus the voltage of node 354 or drain 353 is the programming voltage PROGVOL (9 volts). At this time, since enable signal PROGEN-1 is not activated, voltage at node 352 or gate 351 is zero. Therefore, the voltage difference is between drain 53 and gate 351 is 9 volts (9 volts–zero volt). This voltage difference exceeds the operating voltage limit or the safe value between drain 353 and gate 351, which is about 7 to 8 volts.

When a voltage difference between drain 353 and gate 351 of pass transistor 350 exceeds the safe value, it can cause a voltage breakdown between drain 353 and gate 351. The voltage breakdown can cause a leakage between gate 351 and drain 353, which causes pass transistor 350 to operate inefficiently. The voltage breakdown can also cause gate 351 and drain 353 to short, which leads to failure of pass transistor 350.

In FIG. 3, circuit 220 is designed to protect pass transistor 350 from the voltage breakdown. Circuit 220 reduces the voltage difference between drain 353 and gate 351 to a safe value when programming circuit is not activated. When programming circuit 150-1 is not used, or enable signal PROGEN-1 is not activated but one of the other programming circuits is used, circuit 220 keeps node 354 at a predetermined voltage, which is smaller than the programming voltage PROGVOL. The predetermined voltage is about 2.5 volts. In other words, when enable signal PROGEN-1 is not activated, circuit 220 passes only a part or a portion of the programming voltage PROGVOL to node 354.

Referring to FIG. 3, when programming circuit 150-1 is used in a programming operation, the signal PROGEN-1 is activated or makes a transition from LOW to HIGH, which makes the voltage at node 346 equal Vccp (HIGH). The voltage level of node 352 will be at about Vccp-Vt (about 3 volts). This is just like the case described above without circuit 220 in FIG. 4. Since node 346 also connects to the gate of transistor 362, node 346 turns on transistor 362, which pulls node 364 to Vccp-Vt. Since the gate of transistor 366 connects to Vccp, transistor 366 is on charging node 370 up to Vccp-Vt (same voltage level of node 364). When node 370 is at Vccp-Vt, transistor 366 is off, which keeps node 370 float or disconnected from node 364. At this point transistor 368 is on in anticipating to pass the programming voltage PROGVOL from input pad 152 to node 354.

After node 370 is charged up to Vccp-Vt (about 3 volts), the programming voltage PROGVOL (about 9 volts) is applied to input pad 152. Transistor 368 passes the programming voltage PROGVOL from input pad 152 to node 354. This is similar to the case when pass transistor 350 passes the programming voltage PROGVOL from input pad 354 to node 240-1 as described in FIG. 4 (without circuit 220). Since node 354 connects to node 370 by capacitor 372, an increase in voltage level of node 354 causes an increase in the voltage level of node 370 by a fraction amount. Thus when the voltage level of node 354 increases from zero to 9 volts (increased by 9 volts), the voltage level of node 370 increases from 3 volts to approximately 10 to 11 volts (increased by 7 to 8 volts). The voltage from node 354 is subsequently passed to node 240-1 by pass transistor 350 in the same manner as described in FIG. 4. In summary, when programming circuit 150-1 is used or enable signal PROGEN-1 is activated, circuit 220 passes the entire programming voltage PROGVOL from input pad 152 to node 354. Subsequently, circuit 230 passed the programming voltage PROGVOL from node 354 to node 240-1.

When programming circuit 150-1 is not used or enable signal PROGEN-1 is not activated but one of the other programming circuits is used, circuit 220 passes only a portion of the programming voltage PROGVOL to node 354. In other words, circuit 220 applied a predetermined voltage to node 354. The predetermined voltage is smaller than the programming voltage PROGVOL. When enable signal PROGEN-1 is not activated, node 310 is LOW. This makes the voltage level of nodes 334 and 346 LOW. A LOW on 346 turns on transistor 360, which pulls the voltage level of node 364 to Vcc. At this time, transistor 366 is on, keeping the voltage of node 370 at Vcc. In this case, transistor 366 stays on because its gate is Vccp, which is always higher than Vcc of node 364. Since node 370 is held at Vcc and PROGVOL is 9V the voltage difference across node 367 and 370 is less than 7V, also, node 370 is kept at Vcc (because transistor 366 stays on), node 354 is also kept at almost Vcc-V$_T$. Since node 354 is kept at Vcc-V$_T$, which is about 1.8 volts, and node 352 at this time is zero volt, the voltage difference between node 354 and 351 is about 1.8 volts (1.8 volts–zero volt). In other words, the voltage difference between drain 353 and gate 351 is also about 1.8 volts, which does not exceed the safe value between drain 353 and gate 351. Therefore, pass transistor 350 does not have a voltage breakdown.

In summary, when programming circuit 150-1 is used or enable signal PROGEN-1 is activated, circuit 220 passes the programming voltage PROGVOL from input pad 152 to node 354. Subsequently, pass transistor 350 of circuit 230 passes the programming voltage PROGVOL from node 354 to node 240-1. In this case, the voltage difference between drain 353 and gate 351 is about 1 to 2 volts, which does not exceed the operating voltage limit or the safe value, preventing pass transistor 350 from a voltage breakdown. When programming circuit 150-1 is not used or enable signal PROGEN-1 is not activated but one of the other programming circuits is used, circuit 220 passes only a portion of the programming voltage PROGVOL from node 354. In this case, the voltage difference between drain 353 and gate 351 is about VCC-V$_T$ or 1.8 volts, which also does not exceed the safe value and also preventing pass transistor 350 from a voltage breakdown.

Figure 5:
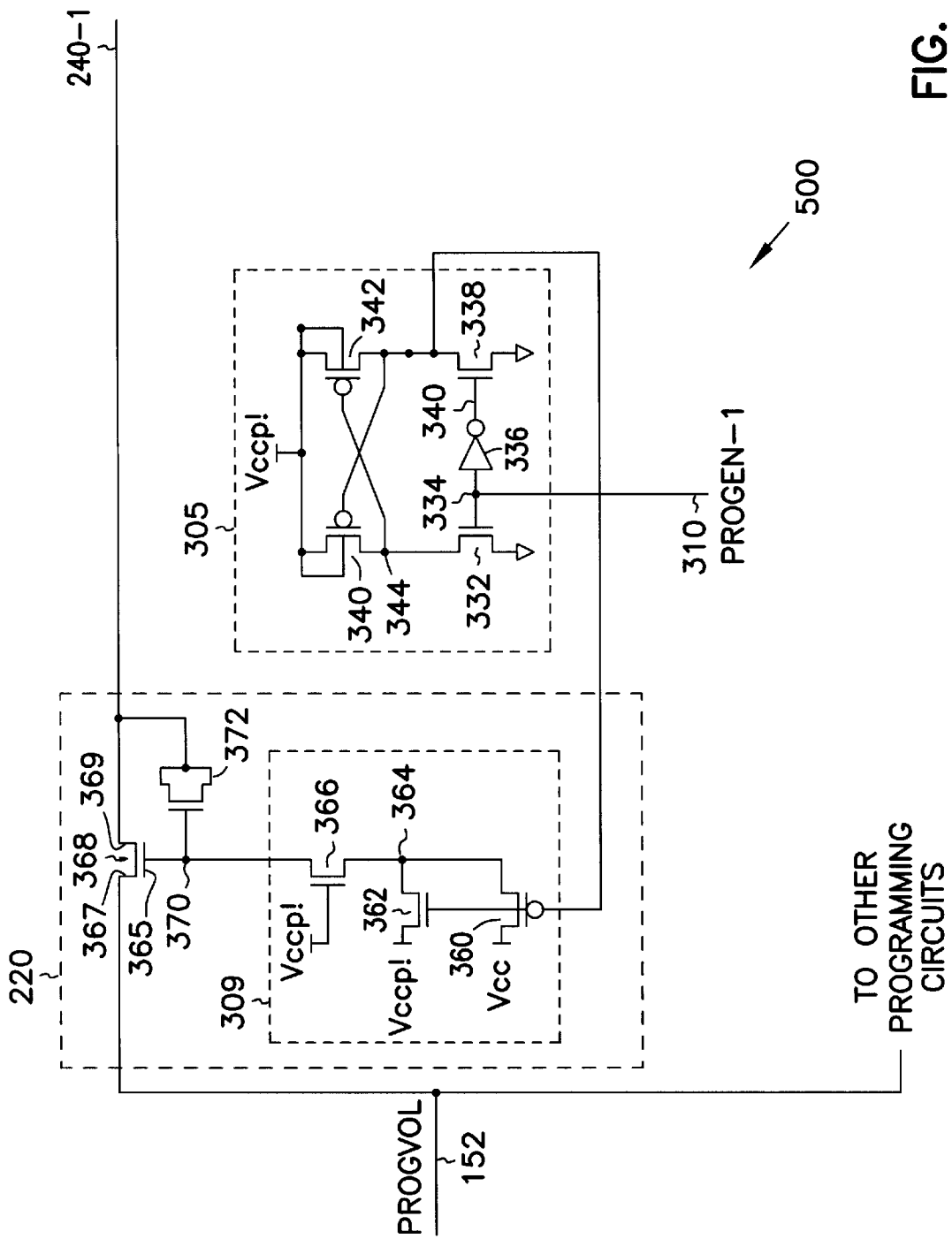
FIG. 5 illustrates a schematic diagram a programming circuit according to another embodiment of the invention.

FIG. 5 illustrates a schematic diagram of programming circuit 500 according to another embodiment of the invention. Programming circuit 500 can be a substitute for each of the programming circuits 150 1–N of FIG. 3. Programming circuit 500 is similar to each of the programming circuits 150 1–N of FIG. 3 except that some elements of circuit 230 of FIG. 3 are not included. Therefore, for simplicity, reference numbers of same elements between programming circuit 150-1 and programming circuit 500 are kept the same. In FIG. 5, programming circuit 500 includes bootstrap-regulator circuit 220 and enable circuit 305. Node 240-1 connects to memory macro 210-1 to program programmable elements 216 1–X as in shown in FIG. 2. The operation of programming circuit 500 is also similar to the operation of programming circuit 150-1 of FIG. 3. In FIG. 5, circuit 220 passes only a portion of the programming voltage PROGVOL from input 152 to programming node 240-1 when programming circuit 500 is not activated. In this case, the circuit 220 reduces the voltage difference between drain 367 and gate 365 to a safe value, but still keeps the voltage at node 240-1 low enough such that programming elements 216 1–X connected to node 240-1 will not be programmed. In other words, a voltage value of the portion of the programming voltage PROGVOL passed to node 240-1 is less than a voltage value necessary to program programmable elements 216 1–X.

In operation, enable signal PROGEN-1 of node 310 is activated or makes a transition from LOW to HIGH. A High on node 310 turns on transistor 362, which pulls node 364 to Vccp-Vt. Since the gate of transistor 366 connects to Vccp, transistor 366 is on at this time charging node 370 up to Vccp-Vt (same voltage level of node 364). When node 370 is at Vccp-Vt, transistor 366 is off, which keeps node 370 float or disconnected from node 364. At this point transistor 368 is on.

After node 370 is at Vccp-Vt (about 3 volts), the programming voltage PROGVOL (about 9 volts) is applied to input pad 152. Transistor 368 passes the programming voltage PROGVOL from input pad 152 to node 240-1. This is similar to the case when pass transistor 350 passes the programming voltage PROGVOL from node 354 to node 240-1 as described in FIG. 4. Since node 240-1 connects to node 370 by capacitor 372, an increase in voltage level of node 240-1 causes an increase in the voltage level of node 370 by a fraction amount. Thus when the voltage level of node 354 increases from zero to 9 volts (increased by 9 volts), the voltage level of node 370 increases from 3 volts to 10–11 volts (increased by 7 to 8 volts). Since node 370 is always higher than the voltage of node 240-1, the voltage at input pad 152 is fully passed to node 240-1 by transistor 368. In addition, the voltage difference between drain 353 and gate 351 is about 1 to 2 volts (11 volts–9 volts), which does not exceed the safe value, preventing pass transistor 368 from a voltage breakdown.

When programming circuit 500 is not used, signal PROGEN-1 is not activated, thus, node 310 is LOW. This causes the voltage level of node 346 to be LOW or zero. A LOW on node 346 turns on transistor 360, which pulls the voltage level of node 364 to Vcc. At this time, transistor 366 is keeping the voltage of node 370 at Vcc. In this case, transistor 366 stays on because the voltage at its gate is Vccp which is always higher than the voltage Vcc of node 364. Node 370 is kept at Vcc (because transistor 366 stays on), node 240-1 is also kept at almost Vcc-Vt by capacitor 372. This Vcc-Vt level is not enough to program elements 216 1–X. In addition, the voltage difference between drain 353 and gate 351 is about 6.5 V volts (9 volts–2.5 V volts), which does not exceed the safe value, preventing pass transistor 368 from a voltage breakdown.

Figure 6:
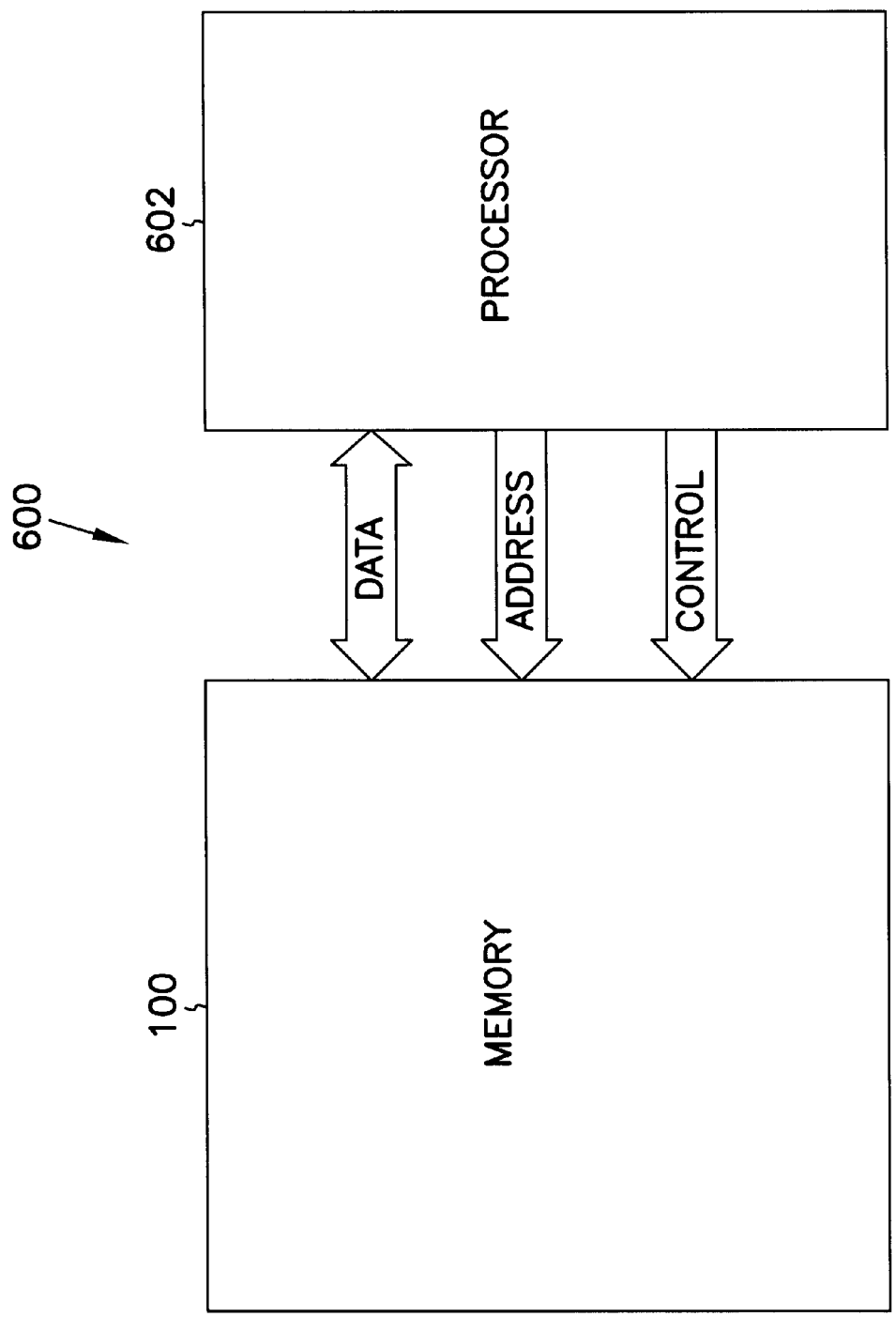
FIG. 6 illustrates a system according to the invention.

FIG. 6 illustrates a system according to the invention. In the Figure, system 600 includes a processor 602 connected to a memory device 100. Memory device 100 of the invention is described above in FIGS. 1–5. According to the invention, processor 602 provides control signals to memory device 100 via control lines (CONTROL). Data communication between the processor and the memory is transmitted via data lines or a data bus (DATA), and addresses are provided to the memory via address lines or address bus (ADDRESS). In one embodiment, processor 602 and memory device 100 are fabricated on a single chip.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An integrated circuit comprising:
   an input pad to receive a programming voltage;
   a precharge circuit connected between the input pad and a programming node; and
   an enable circuit connected to the precharge circuit, the enable circuit having an enable input to receive an enable signal, wherein the precharge circuit passes the programming voltage to the programming node when the program enable signal is activated, wherein the precharge circuit passes only a part of the programming voltage to the programming node when the program enable signal is not activated.

2. The integrated circuit of claim 1, wherein the precharge circuit comprises:
   a transistor connected between the input pad and the programming node;
   a capacitor connected between a gate of the transistor and the programming node; and
   a switch connected between the gate of the transistor and the enable circuit.

3. The integrated circuit of claim 2, wherein the switch keeps the gate of the transistor at a first voltage when the enable signal is activated and at a second voltage when the enable signal is not activated.

4. The integrated circuit of claim 3, wherein the first voltage is greater than the programming voltage, and the second voltage is smaller than the programing voltage.

5. The integrated circuit of claim 4, wherein the programming voltage is at least 9 volts, the first voltage is about 11 volts, and the second voltage is about 2.5 volts.

6. An integrated circuit comprising:
   an input pad to receive a programming voltage;
   a bootstrap-regulator circuit connected to the input pad; and
   a bootstrap-precharge circuit connected to the bootstrap-regulator circuit at a transfer node, the bootstrap-precharge circuit having an enable input to receive a program enable signal, when the program enable signal is activated the bootstrap-regulator circuit passes the programming voltage to the transfer node and the bootstrap-precharge circuit passes the programing voltage from the transfer node to the programming node, when the program enable signal is not activated, the bootstrap-regulator circuit: keeps the transfer node at a predetermined voltage and the bootstrap-precharge circuit keeps the programming node at ground.

7. The integrated circuit of claim 6, wherein the programming voltage is about 9 volts.

8. The integrated circuit of claim 6, wherein the predetermined voltage is about 2.5 volts.

9. The integrated circuit of claim 6, wherein the programming voltage is about 9 volts and the predetermined voltage is about 2.5 volts.

10. The integrated circuit of claim 6, wherein the bootstrap-regulator circuit comprises:
    a transistor connected between the input pad and the programming node;
    a capacitor connected between a gate of the transistor and the transfer node; and
    a voltage regulator connected between the gate of the transistor and the enable circuit.

11. The integrated circuit of claim 6, wherein the bootstrap-precharge circuit comprises:
    a pass transistor connected between the transfer node and the programming node;
    a capacitor connected between a gate of the pass transistor and the programming node;
    an enable circuit connected to the enable input the gate of the pass transistor and the precharge circuit; and
    a pull down circuit connected to the enable input, the enable circuit and the programming node.

12. An integrated circuit comprising:
    an input pad to receive a programming voltage;
    a programming node;
    a transistor having a gate, a source, and a drain, the drain connecting to the input pad, and the source connecting to the programming node;
    a capacitor connected between the gate and the programming node;
    a voltage regulator connected to the gate; and a enable circuit connected to the voltage regulator, the enable circuit having an enable input to receive an enable signal, wherein when the enable signal is activated, the voltage regulator asserts a first voltage to the gate such that the entire programming voltage from the input pad is passed to the programming node, wherein when the enable signal is not activated the voltage regulator asserts a second voltage to the gate such that only a portion of programming voltage from the input pad is passed to the programming node.

13. The integrated circuit of claim 12, wherein the first voltage is always greater than a voltage of the programming node, and the second voltage is smaller than the programing voltage.

14. The integrated circuit of claim 12, wherein the programming voltage is at about 9 volts, the first voltage is about 11 volts, and the second voltage is about 2.5 volts.

15. A memory device comprising:
an input pad to receive a programming voltage;
a plurality of memory macros, each of the memory macros having memory cells and programmable elements; and
a plurality of programming circuits connected between the input pad and the memory macros, each of the programming circuits comprising:
a bootstrap-regulator circuit connected between the input pad and a programming node; and
an enable circuit connected to the bootstrap-regulator circuit, the enable circuit having an enable input to receive an enable signal, wherein the bootstrap-regulator circuit passes the programming voltage to the programming node to program the programmable elements when the program enable signal is activated, wherein the bootstrap-regulator circuit passes only a part of the programming voltage to the programming node when the program enable signal is not activated.

16. The memory device of claim 15, wherein the programmable elements are programmed to store an address of a defective row of the memory cells of the memory macros.

17. The memory device of claim 15, wherein the programmable elements are programmed to store an address of a defective column of the memory cells of the memory macros.

18. A memory device comprising:
an input pad to receive a programming voltage;
a plurality of memory macros having programmable elements; and
a plurality of programming circuits, each of the programming circuit connecting between the input pad and one of the memory macros, each of the programming circuits comprising:
a bootstrap-regulator circuit connected to the input pad; and
a bootstrap-precharge circuit connected to the bootstrap-regulator circuit at a transfer node, the bootstrap-precharge circuit having an input to receive a program enable signal, when the program enable signal is activated, the bootstrap-regulator circuit passes the programming voltage to the transfer node and the bootstrap-precharge circuit passes the programing voltage from the transfer node to the programming node to program the programmable elements, when the program enable signal is not activated, the bootstrap-regulator circuit passes a portion of the programming voltage to the transfer node when and the bootstrap-precharge circuit keeps the programming node at ground.

19. The memory device of claim 18, wherein the programmable elements are programmed to store an address of a defective row of the memory cells of the memory macros.

20. The memory device of claim 18, wherein the programmable elements are programmed to store an address of a defective column of the memory cells of the memory macros.

21. A memory device comprising:
an input pad to receive a programming voltage;
a plurality of memory macros having programmable elements; and
a plurality of programming circuits, each of the programming circuits connecting to the input pad, each of the programing circuits connecting to one of the memory macros at a programming node, each of the programming circuits comprising:
a transistor having a gate, a source, and a drain, the drain connecting to the input pad, and the source connecting to the programming node;
a capacitor connected between the gate and the programming node;
a voltage regulator connected to the gate; and
a enable circuit connected to the voltage regulator, the enable circuit having an enable input to receive an enable signal, wherein when the enable signal is activated, the voltage regulator asserts a first voltage to the gate such that the entire programming voltage from the input pad is passed to the programming node, wherein when the enable signal is not activated the voltage regulator asserts a second voltage to the gate such that only a portion of programming voltage from the input pad is passed to the programming node.

22. The memory device of claim 21, wherein the programmable elements are programmed to store an address of a defective row of the memory cells of the memory macros.

23. The memory device of claim 21, wherein the programmable elements are programmed to store an address of a defective column of the memory cells of the memory macros.

24. A system comprising:
a processor; and
a memory device connected to the process, the memory device comprising:
an input pad to receive a programming voltage;
a plurality of memory macros having programmable elements; and
a plurality of programming circuits connected between the input pad and the memory macros, each of the programming circuits comprising:
a bootstrap-regulator circuit connected between the input pad and a programming node; and
an enable circuit connected to the bootstrap-regulator circuit, the enable circuit having an enable input to receive an enable signal, wherein the bootstrap-regulator circuit passes the entire programming voltage to the programming node when the program enable signal is activated, wherein the bootstrap-regulator circuit passes only a part of the programming voltage to the programming node when the program enable signal is not activated.

25. The system of claim 24, wherein the system further comprising:

a data bus connected between the processor and the memory device; and an address bus connected between the processor and the memory device.

26. A method of programming a memory device, the method comprising:

provoiding a plurality of programming circuits connected, the programming circuit connected between an input pad and a plurality of programming nodes;

activating one of the programming circuits;

applying a programming voltage to the input pad;

passing the programming voltage from the input pad to a transfer node of the activated programming circuit;

passing the programming voltage from the transfer node of the activated programming circuit to a programming node connected to the activated programming circuit;

passing only a portion of the programming voltage from the input pad to transfer nodes of the non-activated programming circuits; and keeping programming nodes connected to non-activated programming circuits at ground.

27. The method of claim 26, wherein activating one of the programming circuits includes applying a high signal level to an enable input the programming circuit.

28. The method of claim 26, wherein applying includes applying about 9 volts to the input pad.

29. The method of claim 26, wherein passing a portion of the programming voltage includes passing about 1.8 volts to the transfer node.

30. A method of programming a memory device, the method comprising:

activating one programming circuits among a plurality of programming circuits;

applying a programming voltage to an input pad connected to all programming circuits;

passing the programming voltage to a programming node that connects to the activated programming circuit; and passing only a portion of the programming voltage to programming nodes that connect to non-activated programming circuits.

31. The method of claim 30, wherein applying includes applying about 9 volts to the input pad.

32. The method of claim 30, wherein passing a portion includes passing about 1.8 volts to the programming node.

33. The method of claim 30, wherein passing a portion includes passing a voltage value that is less than a voltage value necessary to program programmable elements connected to the non-activated programming circuits.

* * * * *

UNITED STATES PATENT AND TRADEMARK OFFICE
CERTIFICATE OF CORRECTION

PATENT NO. : 6,421,282 B1 Page 1 of 1
DATED : July 16, 2002
INVENTOR(S) : Huy Thanh Vo and Raymond A. Turi It is certified that error appears in the above-identified patent and that said Letters Patent is hereby corrected as shown below:

<u>Column 2,</u>
Line 38, insert -- of -- after "diagram".

<u>Column 5,</u>
Line 50, delete ":" after "is".

<u>Column 6,</u>
Line 34, delete "the" after "is".
Line 41, delete "," after "respectively" and insert -- ; --, therefor.

<u>Column 10,</u>
Line 29, delete ":" after "circuit".
Line 54, insert -- of -- after "input".

<u>Column 11,</u>
Line 1, delete "a" and insert -- an --, therefor.

<u>Column 12,</u>
Line 1, delete "when" after "node".
Line 26, delete "a" before "enable" and insert -- an --, therefor.

<u>Column 13,</u>
Line 25, insert -- of -- after "input", therefor.

<u>Column 14,</u>
Line 7, delete "circuits" and insert -- circuit --, therefor.

Signed and Sealed this

Eighteenth Day of March, 2003

JAMES E. ROGAN
*Director of the United States Patent and Trademark Office*